(12) United States Patent
Kamada et al.

(10) Patent No.: US 7,956,372 B2
(45) Date of Patent: Jun. 7, 2011

(54) LIGHT EMITTING DEVICE

(75) Inventors: Kazuo Kamada, Hirakata (JP); Yasushi Nishioka, Tsu (JP); Youji Urano, Ikeda (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 528 days.

(21) Appl. No.: 12/067,194

(22) PCT Filed: Dec. 28, 2005

(86) PCT No.: PCT/JP2005/024031
§ 371 (c)(1),
(2), (4) Date: Mar. 18, 2008

(87) PCT Pub. No.: WO2007/034575
PCT Pub. Date: Mar. 29, 2007

(65) Prior Publication Data
US 2009/0267093 A1 Oct. 29, 2009

(30) Foreign Application Priority Data

Sep. 20, 2005 (JP) .................. 2005-272832
Nov. 18, 2005 (JP) .................. 2005-334683

(51) Int. Cl.
*H01L 33/48* (2010.01)
(52) U.S. Cl. .................. 257/98; 257/100; 257/E33.059
(58) Field of Classification Search .................. 257/98, 257/100, E33.059
See application file for complete search history.

(56) References Cited

U.S. PATENT DOCUMENTS

| 6,445,011 | B1 | 9/2002 | Hirano et al. | |
| 6,713,877 | B2 * | 3/2004 | Hirano et al. | 257/778 |
| 6,717,355 | B2 * | 4/2004 | Takahashi et al. | 313/503 |
| 2002/0145205 | A1 | 10/2002 | Hirano et al. | |
| 2003/0189830 | A1 | 10/2003 | Sugimoto et al. | |
| 2004/0190304 | A1 | 9/2004 | Sugimoto et al. | |
| 2005/0093430 | A1 | 5/2005 | Ibbetson et al. | |
| 2006/0163602 | A1 | 7/2006 | Isokawa | |

(Continued)

FOREIGN PATENT DOCUMENTS

JP 49-90066 8/1974

(Continued)

OTHER PUBLICATIONS

English language Abstract of JP 2005-136224, May 26, 2005.

(Continued)

*Primary Examiner* — Benjamin P Sandvik
*Assistant Examiner* — W. Wendy Kuo
(74) *Attorney, Agent, or Firm* — Greenblum & Bernstein, P.L.C.

(57) ABSTRACT

A light emitting device includes a light emitting diode chip, a heat conductive plate mounting thereon the light emitting diode chip, a sub-mount member disposed between said light emitting diode chip and said heat conductive plate, a dielectric substrate stacked on the heat conductive plate and being formed with a through-hole through which the sub-mount member is exposed, an encapsulation member for encapsulation of said light emitting diode chip, and a lens superimposed on the encapsulation member. The sub-mount member is formed around a coupling portion of the light emitting diode chip with a reflective film which reflects a light emitted from a side face of the light emitting diode chip. The sub-mount member is selected to have a thickness such that the reflecting film has its surface spaced away from said heat conductive plate by a greater distance than said dielectric substrate.

4 Claims, 7 Drawing Sheets

U.S. PATENT DOCUMENTS

| | | |
|---|---|---|
| 2006/0175625 A1 | 8/2006 | Yokotani et al. |
| 2006/0231853 A1 | 10/2006 | Tanaka et al. |
| 2007/0007540 A1 | 1/2007 | Hashimoto et al. |
| 2007/0085103 A1 | 4/2007 | Nishioka et al. |

FOREIGN PATENT DOCUMENTS

| | | |
|---|---|---|
| JP | 62-139367 | 6/1987 |
| JP | 63-293584 | 11/1988 |
| JP | 4-275482 | 10/1992 |
| JP | 10-200165 | 7/1998 |
| JP | 2000-156526 | 6/2000 |
| JP | 2000-286457 | 10/2000 |
| JP | 2001-85748 | 3/2001 |
| JP | 2001-148514 | 5/2001 |
| JP | 2002-94122 | 3/2002 |
| JP | 2003-23183 | 1/2003 |
| JP | 2003-110146 | 4/2003 |
| JP | 2003-188422 | 7/2003 |
| JP | 2005-5433 | 1/2005 |
| JP | 2005-109282 | 4/2005 |
| JP | 2005-136224 | 5/2005 |
| JP | 2005-159045 | 6/2005 |
| JP | 2005-191192 | 7/2005 |
| JP | 2005-209852 | 8/2005 |
| JP | 2005-209958 | 8/2005 |
| JP | 3114129 | 8/2005 |
| WO | 2004/077580 | 9/2004 |

OTHER PUBLICATIONS

English language Abstract of JP 2005-209852, Aug. 4, 2005.
English language Abstract of JP 2005-209958, Aug. 4, 2005.
English language Abstract of JP 2003-188422, Jul. 4, 2003.
English language Abstract of JP 2005-191192, Jul. 14, 2005.
English language Abstract of JP 2000-156526, Jun. 6, 2000.
English language Abstract of JP 2001-148514, May 29, 2001.
English language Abstract of JP 2001-85748, Mar. 30, 2001.

* cited by examiner

LIGHT EMITTING DEVICE

TECHNICAL FIELD

The invention relates to a light emitting device using a LED (Light Emitting Diode) chip.

BACKGROUND ART

Japanese Unexamined Patent Application Publication No. 2001-85748 (hereinafter referred to as patent document 1) and Japanese Unexamined Patent Application Publication No. 2001-148514 (hereinafter referred to as patent document 2) propose a light emitting device which comprises a LED chip, a circuit board mounting the LED chip, a metal frame (e.g. made of aluminum) surrounding the LED chip on the surface of the circuit board, an encapsulation member (e.g. made of transparent resin such as epoxy resin and silicone resin) filled within the frame to encapsulate the LED chip and bonding wires connected to the LED chip. The frame disclosed in the Patent document 1 and 2 is shaped to have an opening area which becomes greater as it is spaced away from the circuit board and is finished to have a mirror interior face which serves as a reflector reflecting a light emitted from the LED chip. However, the above light emitting device is found unsatisfactory in extracting the light efficiently because of that the light radiated from the side faces of the LED chip is absorbed in the circuit board, or leaked through a junction between the frame and the circuit board.

DISCLOSURE OF THE INVENTION

In view of the above problem, the present invention has been accomplished and has an object of providing a light emitting device which is capable of improving its optical output.

The light emitting device in accordance with the present invention comprises the LED chip, a heat conductive plate which is made of a heat conductive material to mount thereon the LED chip, a sub-mount member of being configured to be shaped into a planar plate which is dimensioned to be larger than the LED chip and smaller than the heat conductive plate, a dielectric substrate stacked on the heat conductive member, an encapsulation member being made of a transparent and elastic material to encapsulate the LED chip, and a lens superposed on the encapsulation member. The sub-mount member is disposed between the LED chip and the heat conductive plate to relieve a stress applied to the LED chip due to a difference in linear thermal expansion coefficient between the LED chip and the heat conductive plate. Also, the dielectric substrate is provided on a surface opposite of the heat conductive plate with a pair of lead patterns for electrical connection respectively with electrodes of the LED chip. Further, the dielectric substrate is formed with a through-hole through which the sub-mount member is exposed. The sub-mount member includes a reflection film disposed around a junction of the LED chip to reflect a light emitted from a side wall of the LED chip, and is selected to have a thickness such that the reflecting film has its surface spaced from the heat conductive plate by a greater distance than the dielectric substrate.

Since the light emitting device of the invention is configured to include the sub-mount member with a reflection film having such a thickness that the surface of the reflecting film is spaced from the head conductive plate by a greater distance than from the dielectric substrate, it is capable of preventing the absorption of the light radiated from the side wall of the LED chip in a surface or a side wall of the dielectric substrate, thereby improving optical extraction efficiency with an associated improvement of the optical output.

Generally, a color conversion member is deposited on a surface of the dielectric substrate to convert a color of a light radiated from the LED chip or the metal frame which reflects a light of the LED chip. By selecting the thickness such that the reflecting film has its surface spaced from the heat conductive plate by a greater distance than from the dielectric substrate, it becomes possible to prevent the light from leaking through a juncture between the above color conversion member and the dielectric substrate even if the above color conversion member is disposed on the surface of the dielectric substrate.

Consequently, it becomes possible to improve the optical extraction efficiency, and reduce color shading too.

Preferably, both of the LED chip and the sub-mount member are each configured to have a square planar shape, and the LED chip is disposed centrally of the sub-mount member in such a manner that planar sides of the LED chip crosses respectively with corresponding ones diagonals of the sub-mount member.

In this case, the reflection film can effectively reflect a light radiated from each side walls of the LED chip towards the sub-mount member. Preferably, the light emitting device, further, includes the frame provided on a surface of the dielectric substrate to surround the sub-mount member and said the LED chip, and the encapsulation member is defined by a transparent material filled within the frame. The frame is molded from a transparent resin.

The frame may be configured to determine the size of the encapsulation member. Further, in comparison with a conventional case where the frame is made of a metallic material, the frame molded from a transparent material can reduce a difference in linear thermal expansion coefficient between the frame and the encapsulation member, and to restrain the generation of voids in low temperature condition during a heat cycle test. Moreover, the frame can itself reduce a light reflection loss and therefore improve the light output efficiency.

Preferably, the LED chip is formed on its one surface with one of the electrodes and on the other surface with the other electrode. One of said electrodes adjacent to the sub-mount member is connected to one bonding wires through a conductor pattern on the sub-mount member, while the other electrode away from the sub-mount member is connected to the bonding wire which extends along one of the diagonals of the LED chip.

In this case, the light radiated from the side wall of the LED has a less chance of being blocked by the bonding wires, whereby it is possible to reduce the lowering of the optical extraction efficiency due to the presence of the bonding wires.

Preferably, the light emitting device is configured to further include a dome-shaped color conversion member which is disposed on the dielectric substrate to cover the lens. The color conversion member is a molded member molded from a transparent material mixed with a fluorescent material which is excited by a light emitted from the LED chip and passing through the encapsulation member to radiate a light having a color different from that of the LED chip. Further, the color conversion member is disposed to form an air layer between said color conversion member and a light emitting face of the lens.

The provision of the color conversion member makes it possible to radiate a color different from that of the LED chip. Also, the color conversion member is disposed to form an air layer between the color conversion member and a light emitting face of the lens. When the color conversion member suffers from an external force, the air layer can restrain the color conversion member from transmitting a stress to the LED chip through the lens and the encapsulation member. Further, it becomes possible to reduce an amount of the light being directed and passing through the lens, a fraction of the light which is radiated from the LED chip to be incident upon the color conversion member through the lens and the encapsulation member and is scattered due to the fluorescent particles in the color conversion member. Consequently, an optical extraction efficiency of the whole device can be improved. Further, the LED chip can be protected from moisture in the external atmosphere. Since there is no need to make the color conversion member in an intimate contact to the lens, it becomes possible to reduce a fall of a yield caused by dimensional accuracy or positioning accuracy concerned with the color conversion member.

BEST MODE FOR CARRYING OUT THE INVENTION

Hereinafter, the present invention will be explained in detail with reference to the attached drawings.

Figure 1:
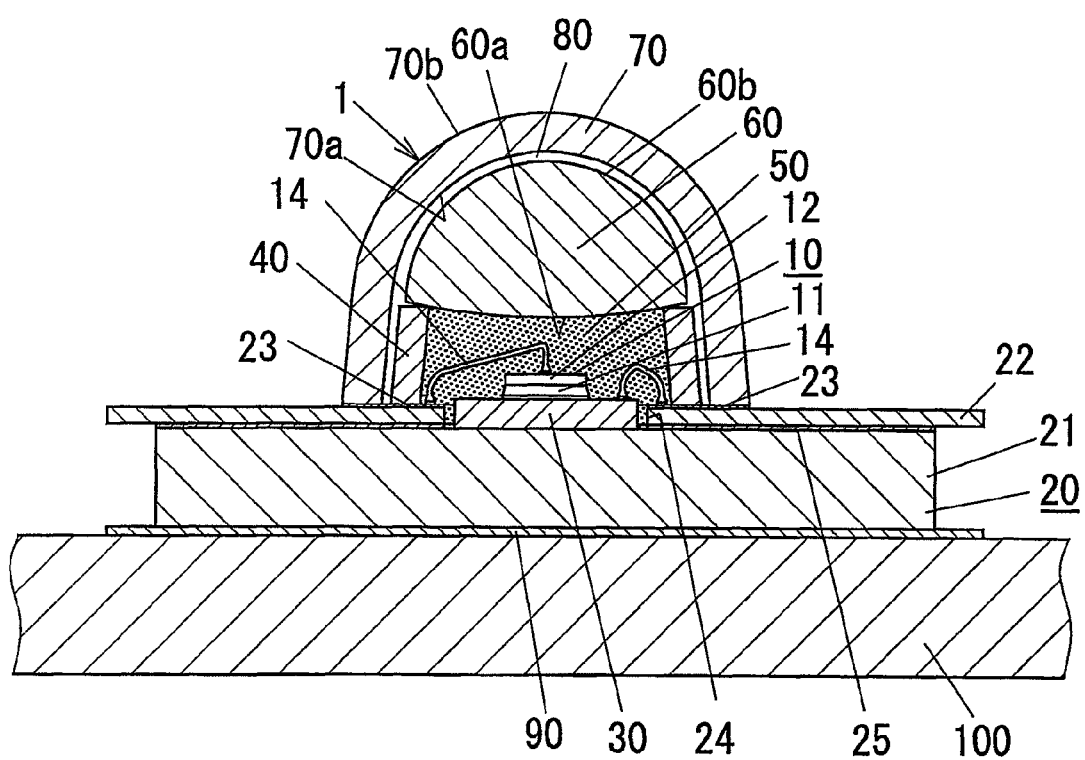
FIG. 1 is a cross-sectional view of a light emitting device in accordance with an embodiment of the present invention.
Figure 2:
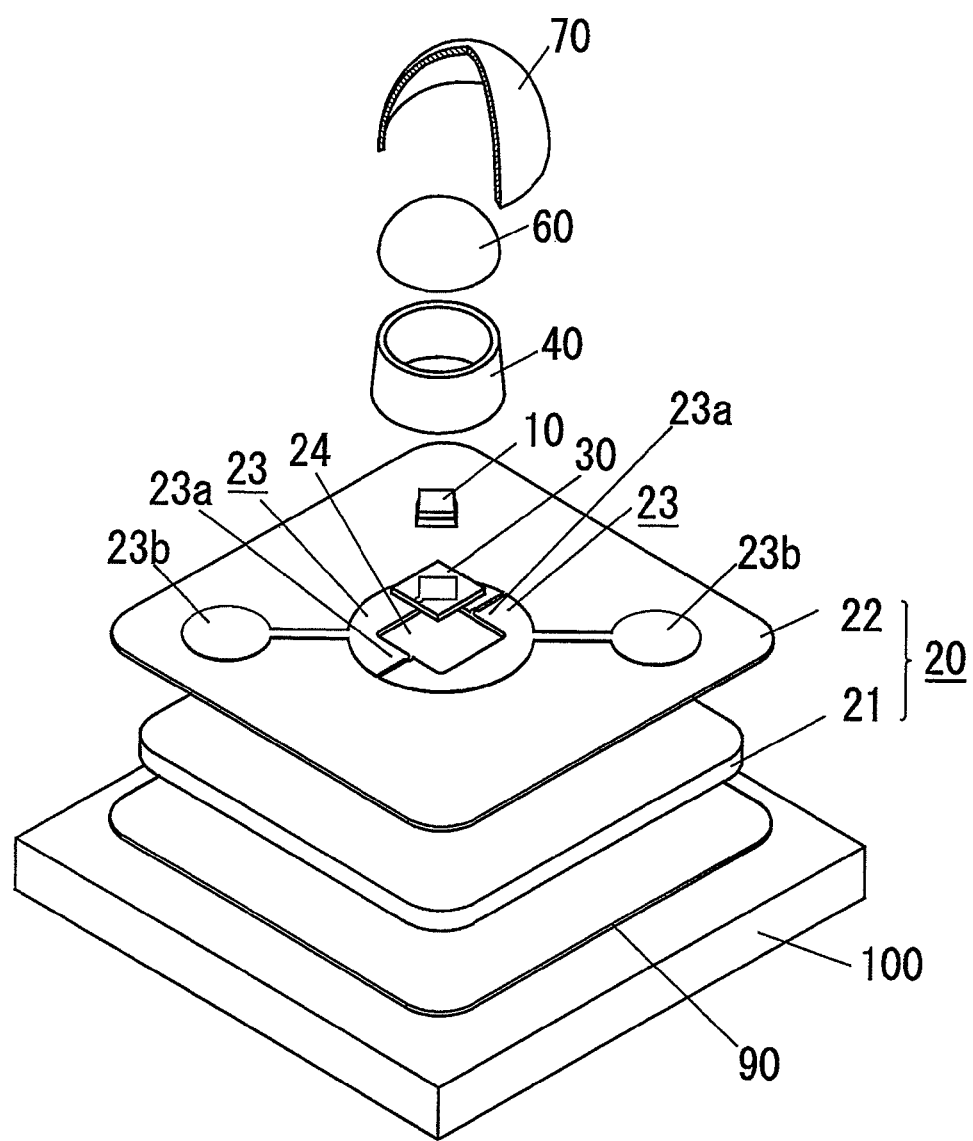
FIG. 2 is a partially cutout exploded perspective view the above device.

As shown in FIGS. 1 and 2, a light emitting device 1 in accordance the present embodiment comprises an LED chip 10, a circuit board 20 made of a thermally conductive material to mount the LED chip 10 thereon, a frame 40 surrounding the LED chip 10 on the surface of the circuit board 20, an encapsulation member 50 which is elastic and is made of a translucent material (transparent resin) filled within the frame 40 to encapsulate the LED chip 10 and bonding wires 14 connected to the LED chip 10, a lens 60 superimposed on the encapsulation member 50, and a dome-shaped color conversion member 70 which is a molded member molded from a transparent material mixed with a fluorescent material and disposed on the circuit board 20 to cover the lens 60. The light emitting device 1 of the present embodiment is adapted in use, for example, as a light source for an illumination appliance, and is mounted on a metal body 100 of the appliance (e.g. made of a metal with a high thermal conductivity such as Al or Cu) through a dielectric layer 90 made of, for example, a green sheet. As being mounted on the metal body 100 of the apparatus, a thermal resistance from the LED chip 10 to the metal body 100 can becomes less to thereby improve heat-dissipation capability. Further, since a temperature rise at a junction of the LED chip can be restricted, an input power can be increased to increase an output power. It is noted in this connection that, when the light emitting devise 1 is used for the illumination appliance, a plurality of the light emitting devices 1 may be mounted on the metal body 100 of the appliance in order to obtain an intended output light power, with the light emitting devices being connected in series or parallel with each other.

The circuit board 20 includes a metal plate 21 and a dielectric substrate 22 made of a glass epoxy board and superimposed on the metal plate 21. The dielectric substrate 22 is provided on its surface opposite of the metal plate 21 with a pair of lead patterns for electrical connection respectively with electrodes (not shown) of the LED chip 10, and is formed with a through-hole 24 through which a sub-mount member 30 mentioned hereinafter is exposed. Although, the metal plate 21 is made of Cu in the present embodiment, it may be made of another metal having a relatively high thermal conductivity, such as Al. Further, in the embodiment, the metal plate 21 is made of a thermally conductive material to define itself as a heat-conductive plate on which the LED chip 10 is mounted. The metal plate 21 is secured to the dielectric substrate 22 by means of an adhesive member 25 made of an dielectric adhesive sheet film. Instead of the adhesive member 25, it is equally possible to provide a coupling metal layer on the dielectric substrate adjacent to the metal plate 21 in order to secure the dielectric substrate 22 to the metal plate 21 by means of the coupling metal layer.

Each of the lead patterns 23 is realized by a laminate composed of a Ni-layer and an Au-layer, and defines an inner lead part 23a by its portion located inwardly of the frame 40, and an outer lead part 23b by its portion not covered by a color transformation member 70. Each of lead patterns 23 is not limited to the laminate of N-layer and Au-layer, and may be realized by a laminate of Cu-layer, Ni-layer, and Ag-layer.

The LED chip 10 is a blue LED chip based on GaN radiating blue light and is configure to have a square planar shape. The LED chip 10 includes an electrically conductive substrate as an epitaxial substrate, which is a n-type SiC substrate having a lattice constant and a crystalline structure closer to those of GaN than sapphire, and being electrically conductive. Formed also on the main surface of the electrically-conductive substrate 11 is a light emitting part 12 which is made of GaN based semiconductor material and is obtained by an epitaxial growth (e.g, MOVPE process) to have a laminated structure, e.g. double-hetero structure. A cathode electrode (n-type electrode) (not shown) is formed on the back side of the electrically-conductive substrate 11 as an electrode on the side of the cathode. An anode electrode (p-type electrode) (not shown) is formed on the surface (a frontmost surface of the principal surface of the conductive substrate 11) of the light emitting part 12 as an electrode on the side of the anode. In short, the LED chip 10 has the anode electrode on its one surface, and has the cathode electrode on the opposite surface.

It is noted that, although the present embodiment has the cathode electrode and the anode electrode each composed of the laminate of Ni-layer and Au-layer, the cathode electrode as well as the anode electrode are not limited to the specific materials, and may be made of a material (e.g. Al) exhibiting a good ohmic property. Further, the present embodiment illustrates that the LED chip 10 is mounted on the metal plate 21 with the light emitting part 12 of the LED chip 10 being spaced further away from the metal plate 21 than from the electrically conductive substrate 11. However, it is equally possible to mount the LED chip 10 on the metal plate 21 with the light emitting part 12 being closer to the metal plate than the electrically conductive plate 11. Although it is desirable to space the light emitting part 12 apart from the metal plate 21 from a viewpoint of optical extraction efficiency, the close disposition of the light emitting part 12 to the metal plate 21 does not increase the optical extraction loss because of that the electrically-conductive substrate 11 and the light emitting part 12 have the refractive index of the same level in the present embodiment.

The LED chip 10 is mounted on the metal plate 21 through the sub-mount member 30 within the through-hole 24. The sub-mount member 30 is shaped into a rectangular plate (a square planar plate in this instance) which is dimensioned to be larger than the LED chip 10 and smaller than the metal plate 21 and relieves a stress applied to the LED chip 10 due to a difference in linear thermal expansion coefficient between the LED chip 10 and the metal plate 21. Further, in addition to relieving the above-mentioned stress, the sub-mount member 30 has a thermal conducting function of conducting the heat generated at the LED chip 10 to the metal plate 21 over an area wider than the size of the chip size of the LED chip 10. The heat generated at the LED chip 10 conducts to the metal plate 21 through the sub-mount member 30 without through the dielectric substrate 22.

It is noted in this connection that, although AlN is adopted as a material of the sub-mount member 30 because of having both relatively high thermal conductivity and insulating performance, the material of the sub-mount member 30 is not limited to AlN, and may be selected to have the linear thermal expansion coefficient relatively close to that of electrically-conductive substrate 11 made of 6H—SiC, and relatively high thermal conductivity, e.g. composite SiC, Si, or and the like.

Figure 4:
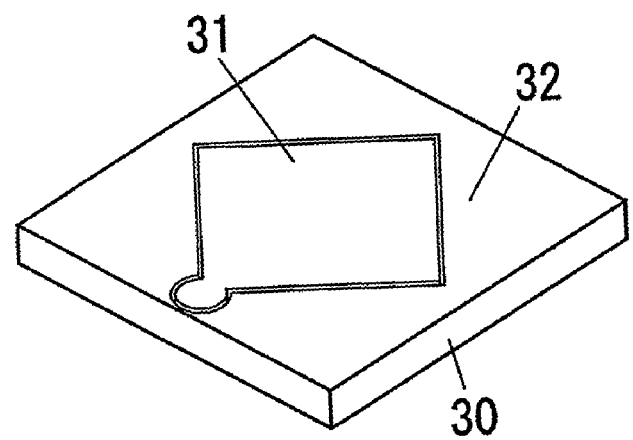
FIG. 4 is a perspective view of a sub-mount employed in the above device.

As shown in FIG. 4, the sub-mount member 30 includes a conductive pattern 31 connected to above-mentioned cathode electrode on the surface of the LED chip 10, and also includes a reflecting film 32 (e.g. laminate of Ni film and Ag film, Al film, and the like) reflecting a light radiated from the side face of the LED chip 10. In short, the sub-mount member 30 includes the reflection film 32 disposed around a juncture of the LED chip 10 to reflect the light radiated from the side face of the LED chip 10. Furthermore, a thickness of the sub-mount member 30 is selected such that the reflecting film 32 has its surface spaced from the metal plate 21 (heat conductive plate) by a greater distance than from the dielectric substrate 22.

By selecting a thickness of the sub-mount member 30 in above-mentioned manner in addition to disposing the reflecting film 32 on the sub-mount member 30, it is capable of preventing the absorption of the light radiated from the side wall of the LED chip 10 in a surface of the sub-mount member 30 and a side wall of the dielectric substrate 22, and also the leakage through a juncture between the color conversion member 70 and the dielectric substrate 22, thereby improving optical extraction efficiency. Moreover, it is possible to reduce color shading by preventing the leakage of the light radiated from the side wall of the LED chip 10 through above-mentioned juncture between the color conversion member 70 and the dielectric substrate 22.

The LED chip 10 has the cathode electrode electrically connected to one of the lead patterns 23 through the conductive pattern 31 and through the bonding wire 14 (e.g. gold thin wire, aluminum thin wire), and has the anode electrode electrically connected to the other lead pattern 23 through the bonding wire 14.

The LED chip 10 is disposed centrally of the sub-mount member 30 in such a manner that the planar sides of the LED chip 10 cross with corresponding diagonals of the sub-mount member 30. In the present embodiment, the LED chip 10 has its center axis substantially aligned with that of the sub-mount member 30 along the thickness thereof with each planar side of the LED chip 10 intersecting the corresponding one of the diagonals at an angle of about 45°. With such arrangement, it is possible to reflect the light radiated from each side wall of the LED chip 10 effectively at the reflecting film 32. The LED chip 10 is disposed centrally of the sub-mount member 30 in such a manner that the planar sides of the LED chip 10 cross with corresponding diagonals of the sub-mount member 30.

Figure 3:
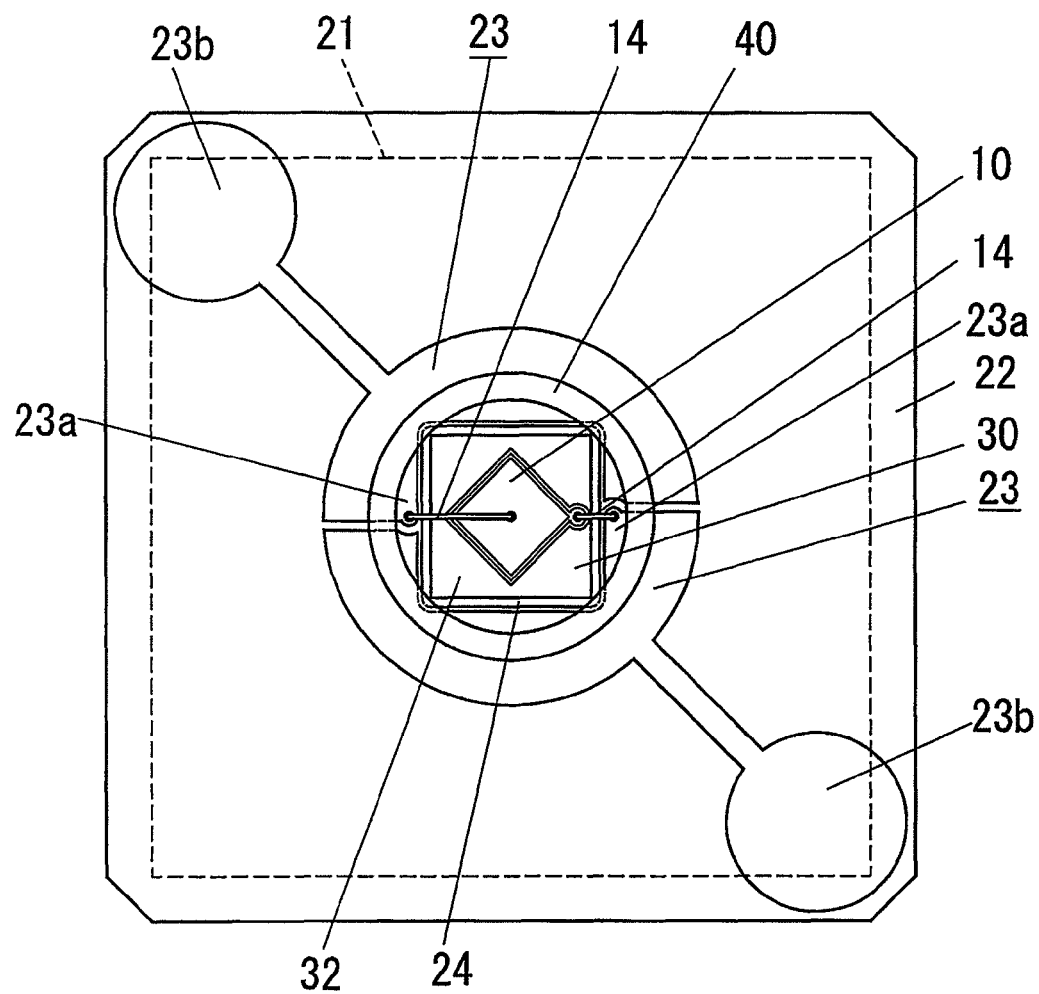
FIG. 3 is a plan view illustrating a principal part of the above device.

As shown in FIG. 3, the light emitting device of the present embodiment is configured such that each of the bonding wires 14 electrically coupled to the LED chip 10 extends in a direction along a diagonal of the LED chip 10 so as to reduce a chance of blocking off the light radiated from each side of the LED chip 10. Consequently, it is possible to restrain lowering of the optical extraction efficiency by the presence of the bonding wire 14.

Although the LED chip 10 and the sub-mount member 30 can be joined by a solder such as SnPb, AuSn, SnAgCu, or a silver paste, they are preferably joined by use of a lead free solder such as AuSn, SnAgCu.

A silicone resin is used for the encapsulation member 50 as a transparent material. However, the encapsulation member may be made of an acrylic resin instead of the silicone resin.

The frame 40 is molded from a transparent resin into a cylindrical shape. The frame 40 is provided on the dielectric substrate 22 to surround the LED chip 10 and the sub-mount member 30. The embodiment illustrates that the frame 40 is made of a silicone resin, namely the transparent material having a linear thermal expansion coefficient nearly equal to that of the encapsulation member 50. When the acrylic resin is used for the encapsulation member 50 instead of the silicone resin, it is desirable to mold the frame 40 by use of an acrylic resin. The embodiment denotes that the encapsulation member 50 is defined by the transparent material which is filled within the frame and heat-cured after the frame 40 is adhered to the circuit board 20.

With the provision of the frame, the size of the encapsulation member 50 can be determined by the frame 40. Furthermore, in comparison with a conventional case where the frame is made of a metallic material, the frame 40 molded from a transparent material can reduce a difference in linear thermal expansion coefficient between the frame 40 and the encapsulation member 50, thereby restraining the generation of voids in low temperature condition during a heat cycle test. Moreover, the frame 40 can reduce a light reflection loss and therefore improve the light output efficiency.

The lens 60 is configured as a double-convex lens having a convex light incident surface 60a opposing the encapsulation 50 and a convex light emitting surface 60b. The lens 60 is molded from a silicone resin to have the same refractive index as the encapsulation 50. The lens 60 is not limited to the silicone resin mold but may be molded from acrylic resin. The light emitting surface 60b of the lens is bulged outwardly so as not to cause the total internal reflection of the light reaching the light incident surface 60a at an interface between the light emitting surface 60b and the above-mentioned air layer 80. Further, the lens 60 is disposed to have its optical axis aligned with a center line of the light emitting part 12 extending through the LED chip 10 in a thickness direction thereof.

The color conversion member 70 is molded from a mixture of a transparent material, e.g. silicone resin and a particulate yellowish fluorescent material which is excited by a blue light emitted from the LED chip 10 and passing through the encapsulation 50 to radiate a broad yellowish white light. The light emitted from the side wall of the LED chip 10 propagates through the encapsulation 50 and the air layer 80 to reach the color conversion member 70, exciting the fluorescent material of the cooler conversion member 70 or passing through the color conversion member 70 without colliding with the fluorescent material. The light emitting device 1 of the present embodiment can give a white light as a combination of the blue light emitted from the LED chip 10 and the light emitted from the yellowish fluorescent material.

The color conversion member 70 has its inner surface 70a shaped in conformity with the light emitting surface 60b of the lens 60, leaving an uniform tangential distance between the light emitting surface 60b and the inner surface 70a of the color conversion member 70 over the entire surface of the light emitting surface 60b. Further, the color conversion member 70 is shaped to have a uniform thickness along the tangential direction.

The color conversion member 70 is secured at the perimeter of its opening to the dielectric substrate 22 by means of a bond (not shown) provided by, for example, an adhesive (e.g. silicone resin, epoxy resin), to leave the air layer 80 confined between the color conversion member 70 and the light emitting surface 60b of the lens and also the frame 40. The presence of the air layer 80 reduces a possibility of the contact between the lens 60 and the color conversion member 70 when the latter is deformed as being subjected to an external force. Therefore, a stress developed at the color conversion member 70 due to the external force can be prevented from being transmitted to the LED chip 10 as well as the bonding wires 14, which reduces degradation of luminescent performance of the LED chip 10 as well as breaking of the bonding wires 14, and therefore giving improved reliability. Further, with the provision of the air layer 80 between the color conversion member 70 and the lens 60, the LED chip 10 can be protected from moisture in the external atmosphere. Furthermore, since there is no need to make the color conversion member 70 in an intimate contact to the lens 60 and the frame 40, it is possible to prevent a lowering of yield which would be otherwise caused by dimensional accuracy or positioning accuracy concerned with the color conversion member 70. Since the color conversion member 70 is assembled last, it is possible to reduce color variance simply by selecting the color conversion member 70 in which the mixing ratio of the fluorescent material to the transparent material is adjusted in relation to the wavelength of the light from the LED chip 10.

Also, with the provision of the air layer 80 between the color conversion member 70 and the lens 60, it becomes possible to reduce an amount of the light being diffused back into the lens 60 from the color conversion member 70, a fraction of the light emitted from the LED chip 10 to be incident upon the color conversion member 70 through the encapsulation member 50 and the lens 60 followed by being scattered by the yellowish fluorescent particles in the color conversion member 70. Consequently, an optical extraction efficiency of the whole device can be improved.

Figure 5A:
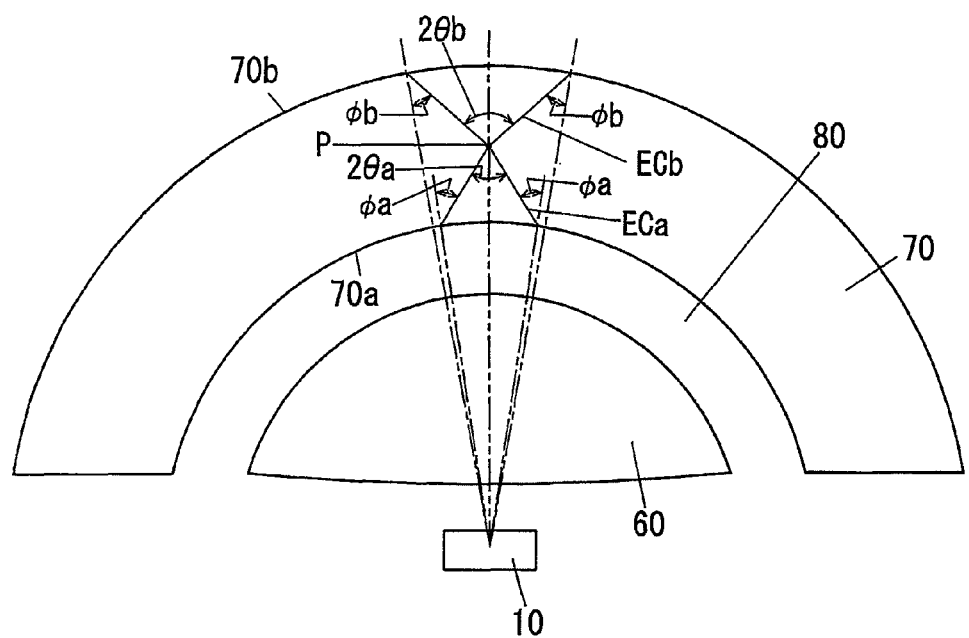
FIG. 5A is an explanatory View of a principal part of the above device.
Figure 5B:
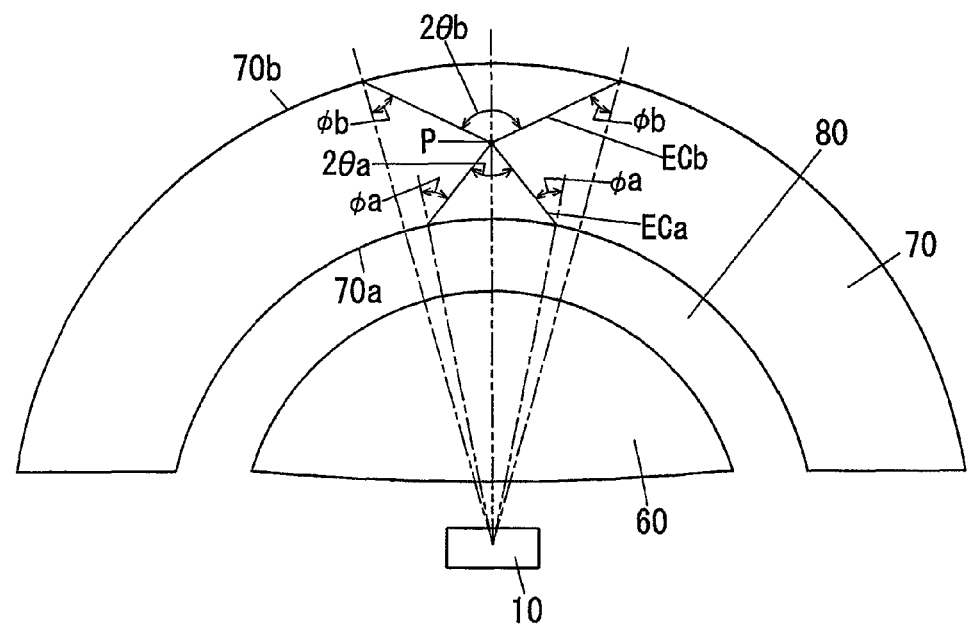
FIG. 5B is an explanatory view of a principal part of the above device.

Explanation is made with reference to FIG. 5A and FIG. 5B in which the optical axis of the color conversion member 70 is aligned with the optical axis of the LED chip so that a blue light radiated from the LED chip 10 is uniformly scattered in every direction from the central point P of the color conversion member 70 along its optical axis. With regard to the light scattered at point P, the color conversion member 70 develops an escape cone ECa having a spread angle 2θa as well as an escape cone ECb having a spread angle 2θb, respectively on inside and outside of the color conversion member 70. The spread are expressed as 2θa=60°, 2θb=98° when the total internal reflection angle φa and φb are 40°, as shown in FIG. 5A, and 2θa=76°, 2θb=1340 when the total internal reflection angle φa and φb are 50° as shown in FIG. 5B, where the total internal reflection angle φa is defined at the interface between the color conversion member 70 and the air layer, while the total internal reflection angle φb is defined at the interface between the color conversion member 70 and an air, a medium outside of the color conversion member 70.

The blue light scatted at point P and directed through the escape cone ECa on the inside of the color conversion member has a maximum emission efficiency η which is expressed as η=(¼n²)×100(%), where n is a refractive index of the transparent material forming the color conversion member 70. Thus, η≈13% when the silicone resin having n=1.4 is utilized as mentioned in the above.

In other words, only 13% of the blue light scattered at point P reflects back to the lens 60 with the provision of the air layer 80 between the color conversion member 70 and the lens 60, while as much as about 50% of the blue light reflects without the air layer. Accordingly, the optical extraction efficiency can be improved and a deterioration of the encapsulation member 50 by blue light can be restrained. It is desirable to use the color conversion member 70 of an increased thickness for reducing the blue light directed through the escape cone ECa.

The transparent material used for the color conversion member 70 is not limited to the silicone resin, but may include, for example, an acrylic resin, an epoxy resin, glass. Further, the fluorescent material mixed to the transparent material for the color conversion member 70 is not limited to the yellowish fluorescent material, and may be replaced with a mixture of a reddish fluorescent material and a greenish fluorescent material which gives a white light. The above embodiment illustrates the use of the SiC substrate as the electrically conductive substrate 11 carrying the LED chip 10 which is the blue LED chip giving a blue luminescence, however, the substrate 11 may be alternatively made of GaN substrate. With the use of the SiC- and GaN-substrate, the epitaxial substrate has a higher thermal conductivity to reduce the thermal resistance as compared to the dielectric sapphire substrate. The LED chip 10 may be configured to emit the red or green light, rather than the blue light. The material of the light emitting part 12 of the LED chip 10 is not limited to the GaN-based semiconductor composite material, but may include GaAs-based semiconductor composite material, or GaP-based semiconductor composite material.

Figure 6:
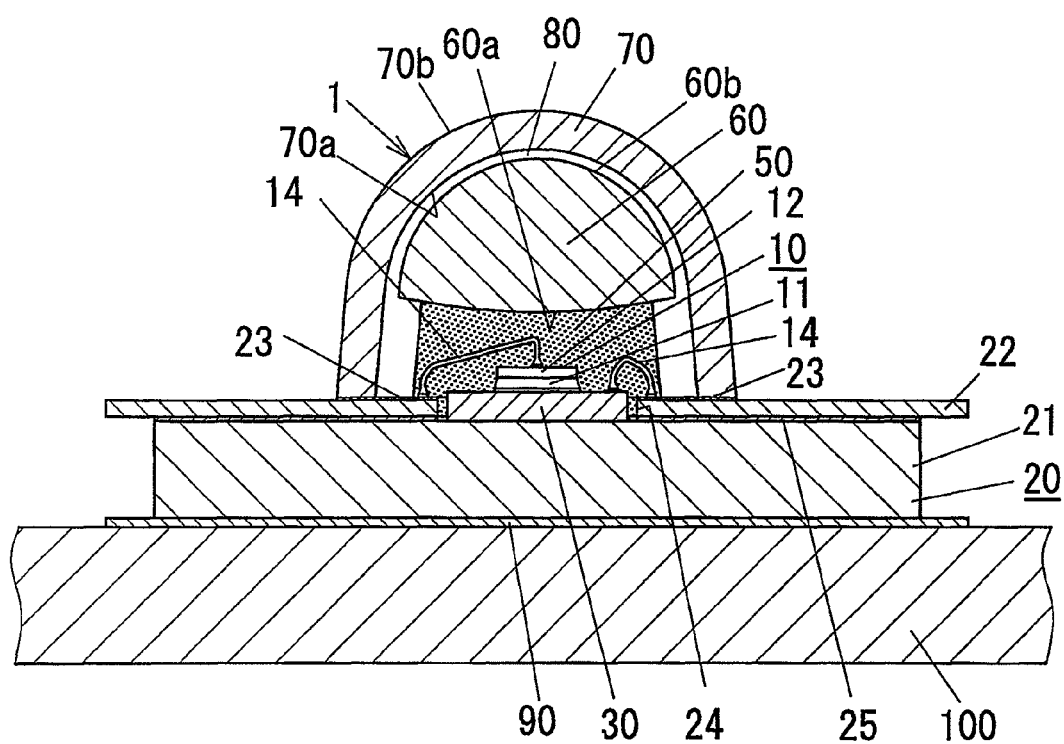
FIG. 6 is a cross-section of another configuration of the above device.
Figure 7:
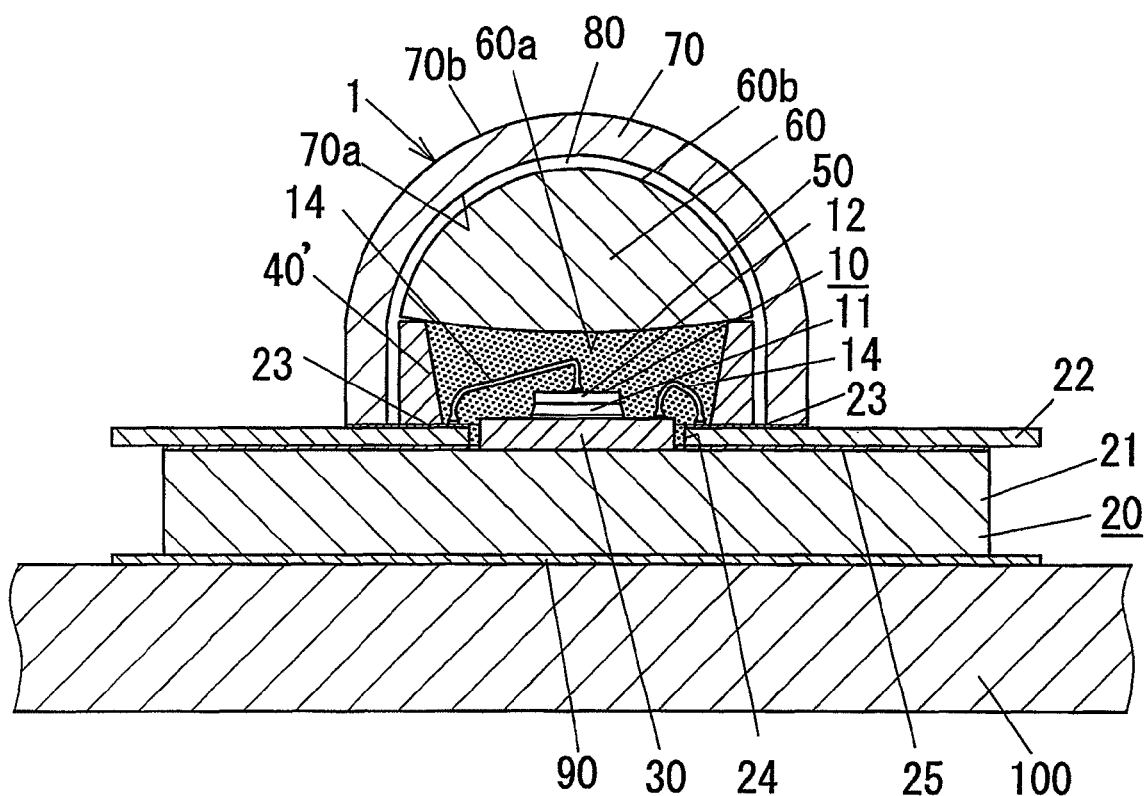
FIG. 7 is a cross-section of a further configuration of the above device.

Furthermore, the electrically-conductive substrate 11 is not limited to the SiC substrate, but may be selected from GaAs substrate, a GaP substrate, and the like in compatible with the material of the light emitting part 12. As discussed in the above, the light emitting device 1 of the present embodiment is configured to include the reflecting film 32 on the sub-mount member 30 and also to select the thickness of the sub-mount member such that the surface of the reflecting film 32 is spaced further away from the metal plate (heat conductive plate) 21 than the surface of the dielectric substrate 22. With this configuration, the light emitted from the side wall of the LED chip 10 can be prevented from being absorbed in the surface of the sub-mount member 30 or in the side wall of the dielectric substrate, and also from being leaked through the juncture between the color conversion member 70 and the dielectric substrate 22, thereby improving the optical output efficiency. With the improved output efficiency, the light output is improved. It is noted that, although the present embodiment illustrates the light emitting device 1 with the frame 40 made of the transparent resin, the frame may be omitted, as shown in FIG. 6.

Further, the light emitting device 1 of the present embodiment may utilizes a frame 40' made of a conventional metal instead of the frame 40 made of the transparent resin. Also in this case, the sub-mount member 30 is selected to have a thickness such that the reflecting film 32 has its surface spaced from the metal plate 21 (heat conductive plate) by a greater distance than from the dielectric substrate 22. Thus, it is also possible to make the light emitting device which is capable of preventing the absorption of the light radiated from the side wall of the LED chip 10 in a side wall of the dielectric substrate 22 and leaking of the light through the juncture between the metal frame 40' and the dielectric substrate 22, thereby improving optical extraction efficiency with an associated improvement of the optical output.

As discussed in the above, apparently many widely different embodiments may be made without departing from the technical concept of the present invention, and therefore the present invention should not be limited to the specific embodiments except as defined in the claims.

The invention claimed is:

1. A light emitting device, comprising:
    a light emitting diode chip;
    a heat conductive plate which is made of a heat conductive material for mounting said light emitting diode chip;
    a sub-mount member of a planar plate which is larger than said light emitting chip and smaller than said heat conductive plate, said sub-mount member being disposed between said light emitting chip and said heat conductive plate to relieve a stress acting upon said light emitting diode chip due to a difference between a linear thermal expansion coefficient for said light emitting diode and a linear thermal expansion coefficient for said heat conductive plate;
    a dielectric substrate stacked on said sub-mount member, said dielectric substrate provided on a surface opposite of said heat conductive plate with a pair of lead patterns for electrical connection with respective electrodes of said light emitting diode chip, said dielectric substrate being formed with a through-hole through which said sub-mount member is exposed;
    an encapsulation member made of a transparent and elastic material to encapsulate said light emitting diode chip; and
    a lens superimposed on said encapsulation member; wherein
    said sub-mount member includes a reflective film disposed around a juncture of said light emitting diode chip to reflect a light emitted from a side face of said light emitting diode chip; and
    said sub-mount member has a thickness such that said reflective film is located at a distance, from said heat conductive plate, greater than a distance between said heat conductive plate and said dielectric substrate;
    a frame is provided on a surface of said dielectric substrate to surround said sub-mount member and said light emitting diode chip, said encapsulation member being defined by a transparent material filled inside of said frame, said frame being molded from a transparent resin; and
    a dome-shaped color conversion member which is disposed on said dielectric substrate to cover said lens, said color conversion member being a molded member molded from a transparent material mixed with a fluorescent material which is excited by a light emitted from said light emitting diode chip and passing through said encapsulation member to radiate a light having a color different from that of the light emitting diode chip, said color conversion member being disposed to form an air layer between said color conversion member and a light emitting face of said lens.

2. The light emitting device of claim 1, wherein
    said light emitting diode chip and said sub-mount member are each configured to have a square planar shape,
said light emitting diode chip being disposed in a center said sub-mount member such that planar sides of said light emitting diode chip cross with corresponding diagonals of said sub-mount member.

3. The light emitting device of claim 1, wherein
    said light emitting diode chip has one electrode formed on one surface and another electrode formed on another surface, one of said electrodes being adjacent to said sub-mount member and being connected to one bonding wire through a conductor pattern on said sub-mount member, said another electrode being located at a distance from said sub-mount member and being connected to another bonding wire, said another bonding wire extending along a diagonal of said light emitting diode chip.

4. The light emitting device of claim 1, wherein
    said frame is formed into a cylindrical shape.

* * * * *